United States Patent
McCormack et al.

(10) Patent No.: US 9,705,204 B2
(45) Date of Patent: Jul. 11, 2017

(54) LOW-PROFILE WIRELESS CONNECTORS

(71) Applicant: Keyssa, Inc., Mountain View, CA (US)

(72) Inventors: Gary D. McCormack, Tigard, OR (US); Ian A. Kyles, West Linn, OR (US)

(73) Assignee: Keyssa, Inc., Campbell, CA (US)

( * ) Notice: Subject to any disclaimer, the term of this patent is extended or adjusted under 35 U.S.C. 154(b) by 4 days.

(21) Appl. No.: 13/657,476

(22) Filed: Oct. 22, 2012

(65) Prior Publication Data
US 2013/0106673 A1    May 2, 2013

Related U.S. Application Data

(60) Provisional application No. 61/549,378, filed on Oct. 20, 2011.

(51) Int. Cl.
*H01Q 21/24*     (2006.01)
*H01Q 1/36*     (2006.01)
(Continued)

(52) U.S. Cl.
CPC .......... *H01Q 21/24* (2013.01); *H01L 23/495* (2013.01); *H01L 23/4951* (2013.01);
(Continued)

(58) Field of Classification Search
CPC ....................................................... H01Q 21/24
(Continued)

(56) References Cited

U.S. PATENT DOCUMENTS 2,753,551 A    7/1956   Richmond
3,796,831 A    3/1974   Bauer
(Continued)

FOREIGN PATENT DOCUMENTS

CN    101212233 A    7/2008
CN    101334470 A    12/2008
(Continued)

OTHER PUBLICATIONS

Office of Engineering and Technology Federal Communications Commission, "Understanding the FCC Regulations for Low-Power, Non-Licensed Transmitters", OET Bulletin No. 63, Oct. 1993, 34 pages.
(Continued)

*Primary Examiner* — Dameon E Levi
*Assistant Examiner* — Walter Davis
(74) *Attorney, Agent, or Firm* — Fenwick & West LLP

(57) ABSTRACT

An electronic device may include a PCB having a substantially planar surface and one or more electronic components mounted thereon. A first EHF communication unit may be mounted on the substantially planar surface of the PCB. The first EHF communication unit may include a first planar die containing a first communication circuit, the first die extending along the substantially planar surface of the PCB in a die plane. A first antenna may be operatively connected to the first circuit by interconnecting conductors, the first antenna being configured to at least one of transmit and receive electromagnetic radiation along a plane of the substantially planar surface of the PCB. The first EHF communication unit may have an uppermost surface having a height from the substantially planar surface of the PCB, the first EHF communication unit height being determined by an uppermost surface of the die, the first antenna, and the interconnecting conductors.

20 Claims, 7 Drawing Sheets

(51) Int. Cl.
*H04B 5/00* (2006.01)
*H05K 1/02* (2006.01)
*H01L 23/66* (2006.01)
*H01L 23/495* (2006.01)
*H05K 1/14* (2006.01)

(52) U.S. Cl.
CPC ........... *H01L 23/66* (2013.01); *H01Q 1/36*
(2013.01); *H04B 5/0031* (2013.01); *H05K*
*1/0239* (2013.01); *H01L 2223/6677* (2013.01);
*H01L 2224/48091* (2013.01); *H01L*
*2224/73265* (2013.01); *H01L 2924/14*
(2013.01); *H01L 2924/15311* (2013.01); *H01L*
*2924/3011* (2013.01); *H05K 1/0243* (2013.01);
*H05K 1/142* (2013.01); *H05K 2201/10098*
(2013.01); *H05K 2201/10446* (2013.01)

(58) Field of Classification Search
USPC ......... 343/700, 893, 702, 846, 700 MS, 701;
375/219
See application file for complete search history.

(56) References Cited

U.S. PATENT DOCUMENTS

| | | |
|---|---|---|
| 3,971,930 A | 7/1976 | Fitzmaurice et al. |
| 4,485,312 A | 11/1984 | Kusakabe et al. |
| 4,497,068 A | 1/1985 | Fischer |
| 4,694,504 A | 9/1987 | Porter et al. |
| 5,485,166 A | 1/1996 | Verma et al. |
| 5,543,808 A | 8/1996 | Feigenbaum et al. |
| 5,621,913 A | 4/1997 | Tuttle et al. |
| 5,754,948 A | 5/1998 | Metze |
| 5,773,878 A | 6/1998 | Lim et al. |
| 5,921,783 A | 7/1999 | Fritsch et al. |
| 5,941,729 A | 8/1999 | Sri-Jayantha |
| 5,956,626 A | 9/1999 | Kaschke et al. |
| 6,072,433 A | 6/2000 | Young et al. |
| 6,252,767 B1 | 6/2001 | Carlson |
| 6,351,237 B1 | 2/2002 | Martek et al. |
| 6,490,443 B1 | 12/2002 | Freeny, Jr. |
| 6,492,973 B1 | 12/2002 | Araki et al. |
| 6,534,784 B2 | 3/2003 | Eliasson et al. |
| 6,538,609 B2 | 3/2003 | Nguyen et al. |
| 6,542,720 B1 | 4/2003 | Tandy |
| 6,554,646 B1 | 4/2003 | Casey |
| 6,590,544 B1 | 7/2003 | Filipovic |
| 6,607,136 B1 | 8/2003 | Atsmon et al. |
| 6,647,246 B1 | 11/2003 | Lu |
| 6,718,163 B2 | 4/2004 | Tandy |
| 6,915,529 B1 | 7/2005 | Suematsu et al. |
| 6,967,347 B2 | 11/2005 | Estes et al. |
| 7,107,019 B2 | 9/2006 | Tandy |
| 7,213,766 B2 | 5/2007 | Ryan et al. |
| 7,311,526 B2 | 12/2007 | Rohrbach et al. |
| 7,512,395 B2 | 3/2009 | Beukema et al. |
| 7,517,222 B2 | 4/2009 | Rohrbach et al. |
| 7,593,708 B2 | 9/2009 | Tandy |
| 7,598,923 B2 | 10/2009 | Hardacker et al. |
| 7,599,427 B2 | 10/2009 | Bik |
| 7,612,630 B2 | 11/2009 | Miller |
| 7,617,342 B2 | 11/2009 | Rofougaran |
| 7,645,143 B2 | 1/2010 | Rohrbach et al. |
| 7,656,205 B2 | 2/2010 | Chen et al. |
| 7,664,461 B2 | 2/2010 | Rofougaran et al. |
| 7,759,700 B2 | 7/2010 | Ueno et al. |
| 7,760,045 B2 | 7/2010 | Kawasaki |
| 7,761,092 B2 | 7/2010 | Desch et al. |
| 7,768,457 B2 | 8/2010 | Pettus et al. |
| 7,769,347 B2 | 8/2010 | Louberg et al. |
| 7,778,621 B2 | 8/2010 | Tandy |
| 7,791,167 B1 | 9/2010 | Rofougaran |
| 7,820,990 B2 | 10/2010 | Schroeder et al. |
| 7,889,022 B2 | 2/2011 | Miller |
| 7,907,924 B2 | 3/2011 | Kawasaki |
| 7,929,474 B2 | 4/2011 | Pettus et al. |
| 7,974,587 B2 | 7/2011 | Rofougaran |
| 8,014,416 B2 | 9/2011 | Ho et al. |
| 8,036,629 B2 | 10/2011 | Tandy |
| 8,041,227 B2 | 10/2011 | Holcombe et al. |
| 8,063,769 B2 | 11/2011 | Rofougaran |
| 8,081,699 B2 | 12/2011 | Siwiak et al. |
| 8,087,939 B2 | 1/2012 | Rohrbach et al. |
| 8,121,542 B2 | 2/2012 | Zack et al. |
| 8,131,645 B2 | 3/2012 | Lin et al. |
| 8,183,935 B2 | 5/2012 | Milano et al. |
| 8,244,179 B2 | 8/2012 | Dua |
| 8,244,189 B2 | 8/2012 | Rofougaran et al. |
| 8,279,611 B2 | 10/2012 | Wong et al. |
| 8,339,258 B2 | 12/2012 | Rofougaran |
| 9,225,120 B2 | 12/2015 | Barr |
| 2002/0106041 A1 | 8/2002 | Chang et al. |
| 2004/0020674 A1 | 2/2004 | McFadden et al. |
| 2004/0113857 A1 | 6/2004 | Gerhard |
| 2004/0214621 A1 | 10/2004 | Ponce De Leon et al. |
| 2005/0109841 A1 | 5/2005 | Ryan et al. |
| 2005/0140436 A1 | 6/2005 | Ichitsubo et al. |
| 2006/0038168 A1 | 2/2006 | Estes et al. |
| 2006/0051981 A1 | 3/2006 | Neidlein et al. |
| 2006/0082518 A1 | 4/2006 | Ram |
| 2006/0128372 A1 | 6/2006 | Gazzola |
| 2006/0159158 A1 | 7/2006 | Moore et al. |
| 2006/0250250 A1 | 11/2006 | Youn |
| 2006/0258289 A1 | 11/2006 | Dua |
| 2007/0024504 A1 | 2/2007 | Matsunaga |
| 2007/0035917 A1 | 2/2007 | Hotelling et al. |
| 2007/0063056 A1 | 3/2007 | Gaucher et al. |
| 2007/0147425 A1 | 6/2007 | Lamoureux et al. |
| 2007/0229270 A1 | 10/2007 | Rofougaran |
| 2007/0278632 A1 | 12/2007 | Zhao et al. |
| 2008/0002652 A1 | 1/2008 | Gupta et al. |
| 2008/0055093 A1 | 3/2008 | Shkolnikov et al. |
| 2008/0089667 A1* | 4/2008 | Grady et al. .................. 386/96 |
| 2008/0112101 A1 | 5/2008 | McElwee et al. |
| 2008/0150799 A1 | 6/2008 | Hemmi et al. |
| 2008/0150821 A1* | 6/2008 | Koch et al. .................. 343/776 |
| 2008/0159243 A1 | 7/2008 | Rofougaran |
| 2008/0165002 A1* | 7/2008 | Tsuji .................. G01S 7/40 340/552 |
| 2008/0192726 A1 | 8/2008 | Mahesh et al. |
| 2008/0195788 A1 | 8/2008 | Tamir et al. |
| 2008/0197973 A1 | 8/2008 | Enguent |
| 2008/0290959 A1 | 11/2008 | Ali et al. |
| 2008/0293446 A1 | 11/2008 | Rofougaran |
| 2009/0006677 A1 | 1/2009 | Rofougaran |
| 2009/0008753 A1 | 1/2009 | Rofougaran |
| 2009/0009337 A1 | 1/2009 | Rofougaran |
| 2009/0010316 A1* | 1/2009 | Rofougaran ............ H01L 23/66 375/219 |
| 2009/0037628 A1 | 2/2009 | Rofougaran |
| 2009/0075688 A1 | 3/2009 | Rofougaran |
| 2009/0094506 A1 | 4/2009 | Lakkis |
| 2009/0098826 A1 | 4/2009 | Zack et al. |
| 2009/0111315 A1 | 4/2009 | Kato et al. |
| 2009/0111390 A1 | 4/2009 | Sutton et al. |
| 2009/0175323 A1 | 7/2009 | Chung |
| 2009/0218407 A1 | 9/2009 | Rofougaran |
| 2009/0218701 A1 | 9/2009 | Rofougaran |
| 2009/0236701 A1 | 9/2009 | Sun et al. |
| 2009/0239392 A1 | 9/2009 | Sumitomo et al. |
| 2009/0239483 A1 | 9/2009 | Rofougaran |
| 2009/0245808 A1 | 10/2009 | Rofougaran |
| 2009/0280765 A1 | 11/2009 | Rofougaran et al. |
| 2010/0009627 A1 | 1/2010 | Huomo |
| 2010/0120406 A1 | 5/2010 | Banga et al. |
| 2010/0127804 A1 | 5/2010 | Vouloumanos |
| 2010/0149149 A1 | 6/2010 | Lawther |
| 2010/0159829 A1 | 6/2010 | McCormack |
| 2010/0167645 A1 | 7/2010 | Kawashima |
| 2010/0202499 A1 | 8/2010 | Lee et al. |
| 2010/0203833 A1 | 8/2010 | Dorsey |
| 2010/0231452 A1 | 9/2010 | Babakhani et al. |
| 2010/0265648 A1 | 10/2010 | Hirabayashi |

(56) References Cited

U.S. PATENT DOCUMENTS

| | | |
|---|---|---|
| 2010/0277394 A1 | 11/2010 | Haustein et al. |
| 2010/0283700 A1 | 11/2010 | Rajanish et al. |
| 2010/0285634 A1 | 11/2010 | Rofougaran |
| 2010/0296252 A1 | 11/2010 | Rollin et al. |
| 2010/0297954 A1 | 11/2010 | Rofougaran et al. |
| 2010/0315954 A1 | 12/2010 | Singh et al. |
| 2011/0038282 A1* | 2/2011 | Mihota .................. H04B 3/52 370/276 |
| 2011/0040909 A1 | 2/2011 | Abdulla |
| 2011/0044404 A1 | 2/2011 | Vromans |
| 2011/0047588 A1 | 2/2011 | Takeuchi et al. |
| 2011/0057291 A1 | 3/2011 | Slupsky et al. |
| 2011/0090030 A1 | 4/2011 | Pagani |
| 2011/0092212 A1 | 4/2011 | Kubota |
| 2011/0127844 A1 | 6/2011 | Walley et al. |
| 2011/0127954 A1 | 6/2011 | Walley et al. |
| 2011/0181484 A1 | 7/2011 | Pettus et al. |
| 2011/0191480 A1 | 8/2011 | Kobayashi |
| 2011/0197237 A1 | 8/2011 | Turner |
| 2011/0207425 A1 | 8/2011 | Juntunen et al. |
| 2011/0285606 A1 | 11/2011 | De Graauw et al. |
| 2011/0286703 A1 | 11/2011 | Kishima et al. |
| 2011/0311231 A1 | 12/2011 | Ridgway et al. |
| 2012/0009880 A1 | 1/2012 | Trainin et al. |
| 2012/0028582 A1 | 2/2012 | Tandy |
| 2012/0064664 A1 | 3/2012 | Yamazaki et al. |
| 2012/0069772 A1 | 3/2012 | Byrne et al. |
| 2012/0072620 A1 | 3/2012 | Jeong et al. |
| 2012/0082194 A1 | 4/2012 | Tam et al. |
| 2012/0083137 A1 | 4/2012 | Rohrbach et al. |
| 2012/0091799 A1 | 4/2012 | Rofougaran et al. |
| 2012/0110635 A1 | 5/2012 | Harvey et al. |
| 2012/0158214 A1 | 6/2012 | Talty et al. |
| 2012/0183091 A1 | 7/2012 | Komori |
| 2012/0214411 A1 | 8/2012 | Levy |
| 2012/0263244 A1 | 10/2012 | Kyles et al. |
| 2012/0286049 A1 | 11/2012 | McCormack et al. |
| 2012/0290760 A1 | 11/2012 | McCormack et al. |
| 2012/0295539 A1 | 11/2012 | McCormack et al. |
| 2012/0307932 A1 | 12/2012 | McCormack et al. |
| 2012/0319496 A1 | 12/2012 | McCormack et al. |
| 2012/0319890 A1 | 12/2012 | McCormack et al. |
| 2013/0070817 A1 | 3/2013 | McCormack et al. |
| 2013/0106673 A1 | 5/2013 | McCormack et al. |
| 2013/0109303 A1 | 5/2013 | McCormack et al. |
| 2013/0157477 A1 | 6/2013 | McCormack |
| 2013/0183903 A1 | 7/2013 | McCormack et al. |
| 2013/0278360 A1 | 10/2013 | Kim et al. |
| 2014/0043208 A1 | 2/2014 | McCormack et al. |

FOREIGN PATENT DOCUMENTS

| | | |
|---|---|---|
| CN | 101919052 A | 12/2010 |
| CN | 101997150 A | 3/2011 |
| CN | 102024290 A | 4/2011 |
| EP | 0 515 187 A2 | 11/1992 |
| EP | 0515187 A2 | 11/1992 |
| EP | 1 298 809 A2 | 4/2003 |
| EP | 1298809 A2 | 4/2003 |
| EP | 1798867 A2 | 6/2007 |
| EP | 2106192 A2 | 9/2009 |
| EP | 2200129 A1 | 6/2010 |
| EP | 2 309 608 A1 | 4/2011 |
| EP | 2309608 A1 | 4/2011 |
| EP | 2328226 A1 | 6/2011 |
| EP | 2 360 923 A1 | 8/2011 |
| EP | 2360923 A1 | 8/2011 |
| GB | 817349 | 7/1959 |
| JP | 06-343053 A | 12/1994 |
| JP | 2001-044715 A | 2/2001 |
| JP | 2011-169342 A | 6/2001 |
| JP | 2003209511 | 7/2003 |
| JP | 2003209511 A | 7/2003 |
| JP | 2008-530844 A | 8/2008 |
| JP | 2009-099280 A | 5/2009 |
| JP | 2011-022640 A | 2/2011 |
| JP | 2011-41078 A | 2/2011 |
| JP | 2011-244179 A | 12/2011 |
| WO | 97/32413 | 9/1997 |
| WO | WO 97/32413 A1 | 9/1997 |
| WO | WO 2009/002464 A2 | 12/2008 |
| WO | WO 2010/124165 A1 | 10/2010 |
| WO | WO 2011/019017 A1 | 2/2011 |
| WO | 2011/114737 A1 | 9/2011 |
| WO | 2011/114738 A1 | 9/2011 |
| WO | WO 2011/114737 A1 | 9/2011 |
| WO | WO 2011/114738 A1 | 9/2011 |
| WO | 2012/129426 A3 | 9/2012 |
| WO | WO 2012/129426 A3 | 9/2012 |
| WO | 2012/155135 A3 | 11/2012 |
| WO | WO 2012/155135 A3 | 11/2012 |
| WO | 2012/166922 A1 | 12/2012 |
| WO | 2012/174350 A1 | 12/2012 |
| WO | WO 2012/166922 A1 | 12/2012 |
| WO | WO 2012/174350 A1 | 12/2012 |
| WO | 2013/006641 A3 | 1/2013 |
| WO | WO 2013/006641 A3 | 1/2013 |
| WO | 2013/040396 A1 | 3/2013 |
| WO | WO 2013/040396 A3 | 3/2013 |
| WO | WO 2013/059801 A1 | 4/2013 |
| WO | WO 2013/059802 A1 | 4/2013 |
| WO | 2013/090625 A1 | 6/2013 |
| WO | WO 2013/090625 A1 | 6/2013 |
| WO | WO 2013/162844 A1 | 10/2013 |
| WO | 2013/059802 A1 | 4/2015 |

OTHER PUBLICATIONS

Vahle Electrification Systems, "CPS Contactless Power System", Catalog No. 9d/E, 2004, 12 pages.

Future Technology Devices International Limited (FTDI), "Technical Note TN_113 Simplified Description of USB Device Enumeration", Doc. Ref. No. FT_000180, Version 1.0, Issue Date Oct. 28, 2009, 19 pages.

Lee W. Young, Authorized Officer, U.S. Patent and Trademark Office, "International Search Report" in connection with related PCT Patent App. No. PCT/US2013/027835, dated May 3, 2013, 4 pages.

Lee W. Young, Authorized Officer, U.S. Patent and Trademark Office, "Written Opinion of the International Searching Authority" in connection with related PCT Patent App. No. PCT/US2013/027835, dated May 3, 2013, 8 pages.

Márquez, T. López, Authorized Officer, European Patent Office, "International Search Report" in connection with related PCT Patent App. No. PCT/US2013/029469, dated Jun. 6, 2013, 5 pages.

Márquez, T. López, Authorized Officer, European Patent Office, "Written Opinion of the International Searching Authority" in connection with related PCT Patent App. No. PCT/US2013/029469, dated Jun. 6, 2013, 5 pages.

Jochen Helms, Authorized Officer, European Patent Office, "International Search Report" in connection with related PCT Patent App. No. PCT/US2013/023665, dated Jun. 20, 2013, 5 pages.

Jochen Helms, Authorized Officer, European Patent Office, "Written Opinion of the International Searching Authority" in connection with related PCT Patent App. No. PCT/US2013/023665, dated Jun. 20, 2013, 10 pages.

L. L. Goldstone, "MM Wave Transmission Polarizer", International Symposium Digest—Antennas & Propagation vol. 2, Jun. 1979, 5 pages.

ECMA International, "Standard ECMA—398: Close Proximity Electric Induction Wireless Communications", Internet citation, Jun. 1, 2011, pp. 1-99.

Chinese Office Action, Chinese Application No. 201280034365.5, Nov. 3, 2014 (with Detailed Summary), 14 pages.

ECMA International, "Standard ECMA—398: Close Proximity Electric Induction Wireless Communications", Internet citation, Jun. 1, 2011, pp. 1-98.

(56) References Cited

OTHER PUBLICATIONS

Future Technology Devices International Limited (FTDI), "Technical Note TN.sub.—113 Simplified Description of USB Device Enumeration", Doc. Ref. No. FT.sub.--000180, Version 1.0, Issue Date Oct. 28, 2009, 19 pages.
Goldstone, L.L. "MM Wave Transmission Polarizer", International Symposium Digest—Antennas & Propagation vol. 2, Jun. 1979, 5 pages.
Japanese Office Action, Japanese Application No. 2014-510541, Nov. 4, 2014, 22 pages.
Juntunen, Eric A. , "60 GHz CMOS Pico-Joule/Bit Oook Receiver Design for Multi-Gigabit Per Second Wireless Communications" thesis paper, Aug. 2008, 52 pages.
PCT International Search Report, PCT Application No. PCT/US2013/029469, Jun. 6, 2013, 5 pages.
PCT Written Opinion, PCT Application No. PCT/US2013/029469, Jun. 6, 2013, 5 pages.
PCT International Search Report, PCT Application No. PCT/US2013/023665, Jun. 20, 2013, 5 pages.
PCT Written Opinion, PCT Application No. PCT/US2013/023665, Jun. 20, 2013, 10 pages.
PCT International Search Report, PCT Application No. PCT/US2012/040214, Aug. 21, 2012, 3 pages.
PCT Written Opinion, PCT Application No. PCT/US2012/040214, Aug. 21, 2012, 8 pages.
PCT International Search Report, PCT Application No. PCT/US2012/042616, Oct. 1, 2012, 4 pages.
PCT Written Opinion, PCT Application No. PCT/US2012/042616, Oct. 1, 2012, 10 pages.
PCT International Search Report, PCT Application No. PCT/US2012/030166, Oct. 31, 2010, 6 pages.
PCT Written Opinion, PCT Application No. PCT/US2012/030166, Oct. 31, 2010, 9 pages.
PCT International Search Report, PCT Application No. PCT/US2012/055488, Dec. 13, 2012, 4 pages.
PCT Written Opinion, PCT Application No. PCT/US2012/055488, Dec. 13, 2012, 8 pages.
PCT International Search Report, PCT Application No. PCT/US2012/045444, Jan. 21, 2013, 7 pages.
PCT Written Opinion, PCT Application No. PCT/US2012/045444, Jan. 21, 2013, 9 pages.
PCT International Search Report, PCT Application No. PCT/US2012/037795, Jan. 21, 2013, 7 pages.
PCT Written Opinion, PCT Application No. PCT/US2012/037795, Jan. 21, 2013, 12 pages.
PCT International Search Report, PCT Application No. PCT/US2012/061345, Jan. 24, 2013, 4 pages.
PCT Written Opinion, PCT Application No. PCT/US2012/061345, Jan. 24, 2013, 7 pages.
PCT International Search Report, PCT Application No. PCT/US2012/061346, Jan. 24, 2013, 5 pages.
PCT Written Opinion, PCT Application No. PCT/US2012/061346, Jan. 24, 2013, 9 pages.
PCT International Search Report, PCT Application No. PCT/US2012/069576, May 2, 2013, 3 pages.
PCT Written Opinion, PCT Application No. PCT/US2012/069576, May 2, 2013, 13 pages.
PCT International Search Report, PCT Application No. PCT/US2013/027835, May 3, 2013, 4 pages.
PCT Written Opinion, PCT Application No. PCT/US2013/027835, May 3, 2013, 4 pages.
PCT International Search Report, PCT Application No. PCT/US2013/023886, Jul. 25, 2013, 7 pages.
PCT Written Opinion, PCT Application No. PCT/US2013/023886, Jul. 25, 2013, 11 pages.
PCT Invitation to Pay Additional Fees, PCT Application No. PCT/US2013/023886, May 3, 2013, 7 pages.
"WirelessHD Specification version 1.1 Overview", www.wirelesshd.org, May 2010, 95 pages.
United States Office Action, U.S. Appl. No. 13/471,052, Sep. 11, 2013, 15 pages.
United States Office Action, U.S. Appl. No. 13/471,052, Feb. 14, 2013, 13 pages.
United States Office Action, U.S. Appl. No. 13/618,138, Jun. 26, 2014, 9 pages.
United States Office Action, U.S. Appl. No. 13/471,058, Jul. 31, 2014, 9 pages.
United States Office Action, U.S. Appl. No. 13/471,058, Feb. 27, 2015, 9 pages.
United States Office Action, U.S. Appl. No. 13/784,581, Oct. 11, 2013, 15 pages.
United States Office Action, U.S. Appl. No. 13/784,581, May 24, 2013, 10 pages.
Eric A. Juntunen, "60 GHz CMOS Pico-Joule/Bit Oook Receiver Design for Multi-Gigabit Per Second Wireless Communications" thesis paper, Aug. 2008, 52 pages.
Murcia Martinez, J., Authorized Officer, European Patent Office, "International Search Report" in connection with related Application Serial No. PCT/US2012/040214, dated Aug. 21, 2012, 3 pages.
Murcia Martinez, J., Authorized Officer, European Patent Office, "Written Opinion of the International Searching Authority" in connection with related Application Serial No. PCT/US2012/040214, dated Aug. 21, 2012, 8 pages.
Ablerga, Vito, Authorized Officer, European Patent Office, "International Search Report" in connection with related Application Serial No. PCT/US2012/042616 dated Oct. 1, 2012, 4 pages.
Ablerga, Vito, Authorized Officer, European Patent Office, "Written Opinion of the International Searching Authority" in connection with related Application Serial No. PCT/US2012/042616 dated Oct. 1, 2012, 10 pages.
Cortes Rosa, Joao, Authorized Officer, European Patent Office, "International Search Report" in connection with related Application No. PCT/US2012/030166, dated Oct. 31, 2010, 6 pages.
Cortes Rosa, Joao, Authorized Officer, European Patent Office, "Written Opinion of the International Searching Authority" in connection with related Application No. PCT/US2012/030166, dated Oct. 31, 2010, 9 pages.
Helms, Jochen, Authorized Officer, European Patent Office, "International Search Report" in connection with related Application No. PCT/US2012/055488, dated Dec. 13, 2012, 4 pages.
Helms, Jochen, Authorized Officer, European Patent Office, "Written Opinion of the International Searching Authority" in connection with related Application No. PCT/US2012/055488, dated Dec. 13, 2012, 8 pages.
Helms, Jochen, Authorized Officer, European Patent Office, "International Search Report" in connection with related Application No. PCT/US2012/045444, dated Jan. 21, 2013, 7 pages.
Helms, Jochen, Authorized Officer, European Patent Office, "Written Opinion of the International Searching Authority" in connection with related Application No. PCT/US2012/045444, dated Jan. 21, 2013, 9 pages.
Helms, Jochen, Authorized Officer, European Patent Office, "International Search Report" in connection with related Application No. PCT/US2012/037795, dated Jan. 21, 2013, 7 pages.
Helms, Jochen, Authorized Officer, European Patent Office, "Written Opinion of the International Searching Authority" in connection with related Application No. PCT/US2012/037795, dated Jan. 21, 2013, 12 pages.
Helms, Jochen, Authorized Officer, European Patent Office, "International Search Report" in connection with related Application No. PCT/US2012/061345, dated 24 Jan. 2013, 4 pages.
Helms, Jochen, Authorized Officer, European Patent Office, "Written Opinion of the International Searching Authority" in connection with related Application No. PCT/US2012/061345, dated Jan. 24, 2013, 7 pages.
Franz, Volker, Authorized Officer, European Patent Office, "International Search Report" in connection with related Application No. PCT/US2012/061346, dated Jan. 24, 2013, 5 pages.
Franz, Volker, Authorized Officer, European Patent Office, "Witten Opinion of the International Searching Authority" in connection with related Application No. PCT/US2012/061346, dated Jan. 24, 2013, 9 pages.

(56) References Cited

OTHER PUBLICATIONS

Bouhana, Emmanuel, Authorized Officer, European Patent Office, "International Search Report" in connection with related Application No. PCT/US2012/069576, dated May 2, 2013, 3 pages.
Bouhana, Emmanuel, Authorized Officer, European Patent Office, "Written Opinion of the International Searching Authority" in connection with related Application No. PCT/US2012/069576, dated May 2, 2013, 13 pages.
Chinese First Office Action, Chinese Application No. 201280054333.1, Mar. 31, 2015, 12 pages.
Chinese First Office Action, Chinese Application No. 201380015101.X, May 6, 2015, 19 pages.
Chinese First Office Action, Chinese Application No. 201280051487.5, Jun. 3, 2015, 14 pages.
Chinese Second Office Action, Chinese Application No. 201280034365.5, Jun. 26, 2015, 7 pages (with English Summary of Office Action Objections).
Chinese Second Office Action, Chinese Application No. 201280054333.1, Nov. 23, 2015, 6 pages.
Chinese Third Office Action, Chinese Application No. 201280034365.5, Nov. 24, 2015, 7 pages.
Chinese Second Office Action, Chinese Application No. 201380015101X, Jan. 20, 2016, 4 pages.
Chinese Second Office Action, Chinese Application No. 201280051487.5, Jan. 14, 2016, 14 pages.
Japanese Office Action, Japanese Application No. 2014-530867, May 1, 2015, 11 pages.
Japanese Office Action, Japanese Application No. 2014-510541, Jul. 17, 2015, 13 pages.
PCT International Search Report, PCT Application No. PCT/US14/12716, Mar. 13, 2015, 4 pages.
PCT Written Opinion, PCT Application No. PCT/US14/12716, Mar. 13, 2015, 6 pages.
United States Office Action, U.S. Appl. No. 13/754,694, Jul. 31, 2015, 9 pages.
United States Office Action, U.S. Appl. No. 14/137,939, Aug. 17, 2015, 8 pages.
United States Office Action, U.S. Appl. No. 14/533,545, Oct. 9, 2015, 10 pages.
United States Office Action, U.S. Appl. No. 13/471,058, Mar. 10, 2016, 10 pages.
United States Office Action, U.S. Appl. No. 13/754,694, Dec. 10, 2015, 8 pages.
Chinese Third Office Action, Chinese Application No. 201280054333.1, May 10, 2016, 4 pages. (with concise explanation of relevance.
Taiwan Office Action, Taiwan Application No. 101133650, Apr. 12, 2016, 5 pages.
Taiwan Office Action, Taiwan Application No. 12103464, May 9, 2016, 16 pages.
European Examination Report, European Application No. 13706116.4, Feb. 8, 2017, 6 pages.
Japanese Office Action, Japanese Application No. 2014-510541, Nov. 9, 2015, 15 pages.
Japanese Office Action, Japanese Application No. 2015-225521, Nov. 7, 2016. 6 pages.
Japanese Office Action, Japanese Application No. 2016-045422, Feb. 6, 2017, 17 pages.
Taiwan Office Action, Taiwan Application No. 102103464, Nov. 10, 2016, 12 pages.
Taiwan Office Action, Taiwan Application No. 101117061, Feb. 6, 2017, 15 pages.
Taiwan Office Action, Taiwan Application No. 105126763, Feb. 10, 2017, 4 pages.
United States Office Action, U.S. Appl. No. 14/533,545, Feb. 16, 2017, 9 pages.
Japanese Office Action, Japanese Application No. 2016-045423, Mar. 27, 2017, 10 pages.
Korean Office Action, Korean Application No. 10-2014-7024547, Mar. 3, 2017, 4 pages (with concise explanation of relevance).
United States Office Action, U.S. Appl. No. 15/355,908, Apr. 7, 2017, 8 pages.

\* cited by examiner

LOW-PROFILE WIRELESS CONNECTORS

CROSS-REFERENCE TO RELATED APPLICATIONS

This application claims the benefit of the U.S. Provisional Patent Application having Ser. No. 61/549,378, filed on Oct. 20, 2011 and entitled "Zero Height Connectors", which is incorporated herein by reference in its entirety for all purposes.

TECHNICAL FIELD

The disclosure relates to data transfer using Extremely High Frequency (EHF) communications devices. More particularly, the disclosure relates to wireless data transfer using EHF communications devices.

BACKGROUND

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic systems with at least two PCBs and the need to communicate information between those PCBs, a variety of connector and backplane architectures have been developed to facilitate information flow between the boards. Unfortunately, such connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling. Finally, conventional mechanical connectors are bulky in comparison to other components typically found mounted on a PCB or otherwise within an apparatus such as a portable electronic device, thus adding significant bulk to the overall dimensions of the device. This is true when the mechanical connector is between two internal circuits, and especially true when the mechanical connector is configured to allow connection between two devices.

BRIEF SUMMARY

In an example, an electronic device is provided having a printed circuit board (PCB) that has one or more electronic components mounted on one of its surface. Also, a first extremely high frequency (EHF) communication unit may be mounted on the surface of the PCB. The first EHF communication unit includes a die positioned on the surface of the PCB, such that the die contains a communication circuit and a first antenna operatively connected to the communication circuit by interconnecting conductors. The first antenna may be configured to act as a transmitter/receiver/transceiver for electromagnetic radiation along the plane of the surface of the PCB. Further, the EHF communication unit may be structured such that it has a height that is determined by a height of a surface of the die, the first antenna, and the interconnecting conductors.

In some examples, an electronic system includes a first electronic device and a second electronic device. The first electronic device may include a first printed circuit board (PCB) having a first set of electronic components mounted on its surface. Also, a first extremely high frequency (EHF) communication unit may be mounted on the surface of the first PCB substantially proximal to a first edge of the first PCB. The first EHF communication unit may include a first die containing a first circuit, the first die extending along the surface of the first PCB and a first antenna operatively connected to the first circuit by interconnecting conductors. The first antenna may be configured to transmit electromagnetic radiation along a plane of the surface of the first PCB. Further, the first EHF communication unit may be structured such that it has a height that is determined by a height of surface of the first die, the first antenna, and the interconnecting conductors. Similarly, the second electronic device may include a second printed circuit board (PCB), the second printed circuit board (PCB) having a second set of electronic components mounted on its surface. Also, a second extremely high frequency (EHF) communication unit may be mounted on the surface of the second PCB substantially proximal to a second edge of the second PCB. The second EHF communication unit may include a second die containing a second circuit, the second die extending along the surface of the second PCB and a second antenna operatively connected to the second circuit by interconnecting conductors.

The second antenna may be configured to receive electromagnetic radiation along a plane of the surface of the second PCB. Further, the second EHF communication unit may be structured such that it has a height that is determined by a height of surface of the second die, the second antenna, and the interconnecting conductors.

In some other examples, a method of communication between a first electronic device and a second electronic device is provided. The first electronic device may include a first PCB and a first set of electronic components mounted on the first PCB, and the second electronic device may include a second PCB and a second set of electronic components mounted on the second PCB. The method may include providing a first EHF communication unit on the first PCB, such that the first EHF communication unit is structured such that it has an uppermost surface having a first height from the surface of the PCB. Thereafter, the method may include providing a second EHF communication unit on the second PCB, such that the second EHF communication unit has an uppermost surface having a second height from the surface of the second PCB. Thereafter, the method may include disposing the first electronic device and the second electronic device such that the first EHF communication unit and the second EHF communication unit are substantially proximal and oriented substantially along a common plane so that the first EHF communication unit and the second EHF communication unit enable communication between the first electronic device and the second electronic device by mutually transmitting and receiving electromagnetic radiation in a direction along the common plane.

Other embodiments and aspects of the disclosure are described in detail herein and are considered a part of the disclosure. For a better understanding of the disclosure with advantages and features, refer to the description and to the drawings.

BRIEF DESCRIPTION OF THE DRAWINGS

Features of the disclosure, which are believed to be novel, are set forth with particularity in the appended claims. The disclosure may best be understood by reference to the following description, taken in conjunction with the accompanying drawings. These drawings and the associated description are provided to illustrate some embodiments of the disclosure, and not to limit the scope of the disclosure.

Figure 1:
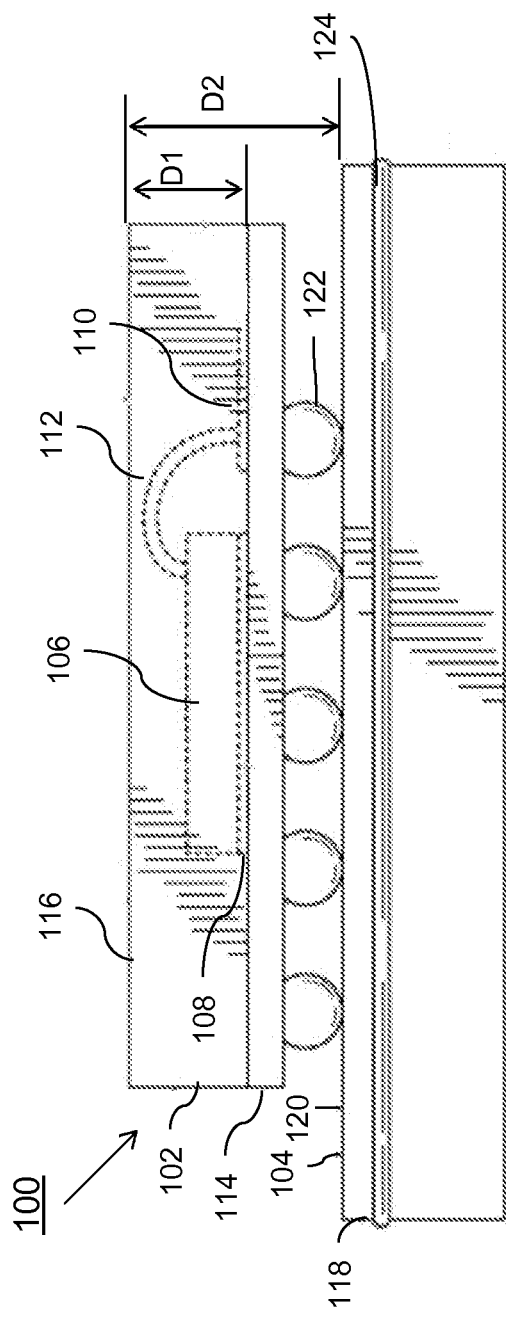
FIG. 1 shows a side view of an exemplary communication unit including an IC package and printed circuit board.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the disclosure.

There may be additional structures described below that are not depicted on one of the described drawings. In the event such a structure is described, but not depicted in a drawing, the absence of such a drawing should not be considered as an omission of such design from the specification.

DETAILED DESCRIPTION

Before describing this in detail, it should be observed that apparatus components and method steps described relate to electronic devices capable of EHF communication. Accordingly the apparatus components have been represented where appropriate by conventional symbols in the drawings, showing only specific details that are pertinent for an understanding of the present inventions so as not to obscure the disclosure with details that will be readily apparent to those with ordinary skill in the art having the benefit of the description herein.

While the specification concludes with the claims defining features that are regarded as novel, it is believed that the inventions will be better understood from a consideration of the following description in conjunction with the drawings, in which like reference numerals are carried forward.

As required, detailed embodiments are disclosed herein; however, it is to be understood that the disclosed embodiments are merely exemplary of the inventions, which can be embodied in various forms. Therefore, specific structural and functional details disclosed herein are not to be interpreted as limiting, but merely as a basis for the claims and as a representative basis for teaching one skilled in the art to variously employ the disclosure in virtually any appropriately detailed structure. Further, the terms and phrases used herein are not intended to be limiting but rather to provide an understandable description.

The terms "a" or "an", as used herein, are defined as one or more than one. The term "another", as used herein, is defined as at least a second or more. The terms "including" and/or "having" as used herein, are defined as "comprising."

When conventional connectors fail, it can lead to degradation of signal integrity and instability of electronic systems needing to transfer data at very high rates, which in turn limits the utility of such products. Additionally, the bulky nature of mechanical connectors may contribute significantly to the overall form factor of electronic devices. Methods and systems are needed for coupling discontiguous portions of high data rate signal paths without the cost, bulk, and power consumption associated with physical connectors and equalization circuits. Additionally, methods and systems are needed to ensure that such solutions are easily manufactured, modular, and efficient.

Examples of such systems are disclosed in U.S. Pat. No. 5,621,913 and U.S. patent application Ser. No. 12/655,041. The disclosures of these and all other publications referenced herein are incorporated by reference in their entirety for all purposes.

Furthermore, in today's society and ubiquitous computing environment, high-bandwidth modular and portable memory devices are being used increasingly. Methods are therefore desirable for ensuring security and stability of communication between and within these devices. In order to provide improved secure high-bandwidth communications, the unique capabilities of EHF communications units may be utilized in innovative and useful arrangements.

An example of an EHF communications unit is an EHF comm-link chip. Throughout this disclosure, the terms comm-link chip, comm-link chip package, and EHF communication link chip package will be used to refer to EHF antennas embedded in IC packages. Examples of such comm-link chips are described in detail in U.S. Provisional Patent Application Ser. Nos. 61/491,811, 61/467,334, 61/485,543, and 61/535,277, all of which are hereby incorporated in their entireties for all purposes. Comm-link chips are an example of a communication device, also referred to as communication unit, whether or not they provide wireless communication and whether or not they operate in the EHF frequency band.

FIG. 1 shows a representative side view of a communication unit 100 including an IC package 102 flip-mounted to an exemplary printed circuit board (PCB) 104. In this example, it may be seen that the IC package 102 includes a die 106, a ground plane 108, an antenna 110, bond wires, including bond wire 112, connecting die 106 to the antenna 110. The die 106, the antenna 110, and the bond wires 112 are mounted on a package substrate 114 and encapsulated in encapsulating material 116. The ground plane 108 may be mounted to a lower surface of the die 106, and may be any suitable structure configured to provide an electrical ground for the die 106. The PCB 104 may include a top dielectric layer 118 having a major face or surface 120. The IC package 102 is flip-mounted to the surface 120 with flip-mounting bumps 122 attached to a metallization pattern (not shown).

Die 106 may include any suitable structure configured as a miniaturized circuit on a suitable die substrate, and is functionally equivalent to a component also referred to as a chip or an integrated circuit (IC). A die substrate may be any suitable semiconductor material; for example, a die substrate may be silicon. In an embodiment, the die 106 may have a length and a width dimension, each of which may be about 1.0 mm to about 2.0 mm, and preferably about 1.2 mm to about 1.5 mm. Die 106 may be mounted with further electrical conductors, such as a lead frame, (not shown in FIG. 1), providing connection to external circuits. Further, a transformer (not shown) may also be provided to provide impedance matching between a circuit on die 106 and antenna 110.

Antenna 110 may be in the form of a folded dipole or a loop antenna. In an example, antenna 110 may be configured to operate at radio frequencies such as in the EHF spectrum, and may be configured to transmit and/or receive electromagnetic signal, in other words to act as a transmitter, a receiver, or a transceiver. Antenna 110 may be separate from but operatively connected to the die 106 by suitable conductors like the bond wires 112, and may be located proximal to die 106. In an embodiment, dimensions of antenna 110 are suitable for operation in the EHF band of the electromagnetic frequency spectrum.

Encapsulating material 116 is used to assist in holding the various components of the IC package 102 in fixed relative positions. Encapsulating material 116 may be any suitable material configured to provide electrical insulation and physical protection for the electrical and electronic components of IC package 102. For example, encapsulating material 116, also referred to as insulating material, may be a mold compound, glass, plastic, or ceramic. Encapsulating material 116 may also be formed in any suitable shape. For example, encapsulating material 116 may be in the form of a rectangular block, encapsulating all components of IC package 102 except the unconnected ends of conductors connecting die 106 to external circuits.

In this example, encapsulating material 116 has a thickness D1 above package substrate 114 that is determined by the structures that it is encapsulating. The top of IC package 102 is accordingly a distance D2 above PCB 104, providing a low-profile assembly. For example, it is sufficient for the encapsulating material to cover conductive connectors 112 because the conductive connectors extend the highest of the package components above the package substrate. If die 106 were flip-mounted on the package substrate, then the conductive connectors would be printed on the package substrate. In this case, the die may have a surface that extends above the other components, in which case the encapsulating material would only need to be thick enough to cover the die.

External connections may be formed to connect the IC package with other circuits or components. For example, external connections may include ball pads and/or external solder balls 122 for connection to the PCB.

PCB 104 may further include a layer 124 spaced from the surface 120 made of conductive material forming a ground plane within PCB 104. PCB ground plane 124 may be any suitable structure configured to provide an electrical ground to circuits and components on the PCB 104.

Figure 2:
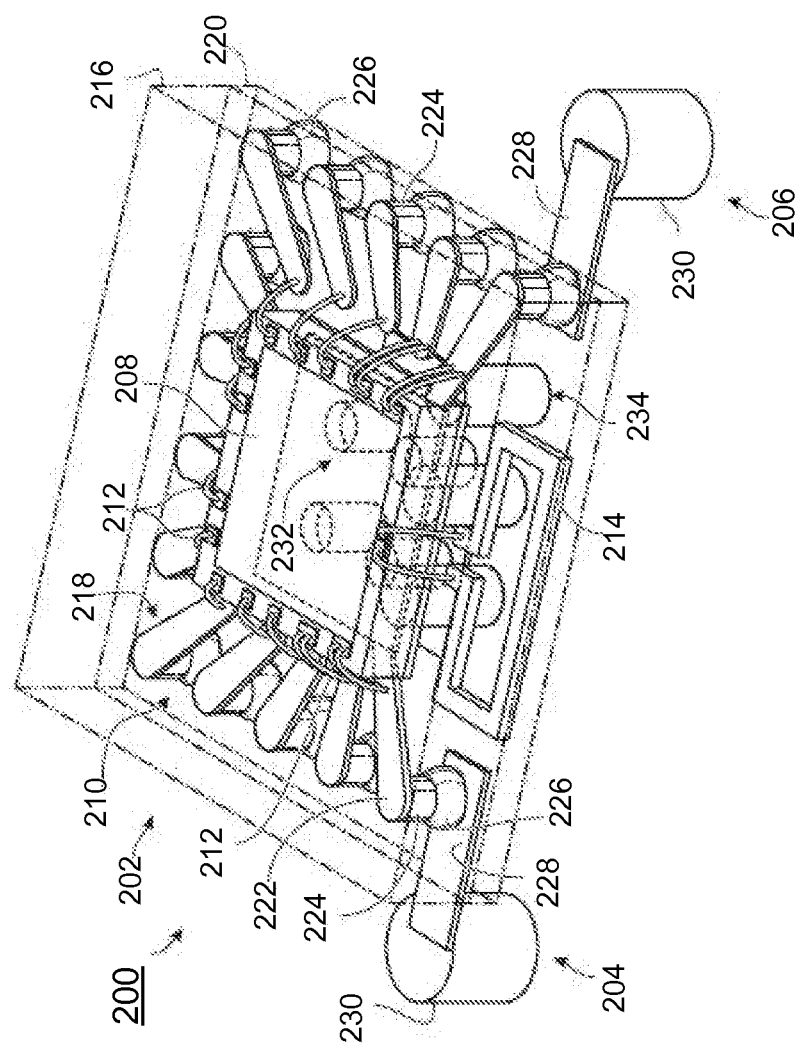
FIG. 2 is a perspective view of another exemplary communication unit including an IC package with external circuit conductors.

Turning to FIG. 2, another exemplary communication unit 200 is shown, including an IC package 202 with external circuit conductors 204 and 206. In this example, IC package 202 may include a die 208, a lead frame 210, conductive connectors 212 in the form of bond wires, an antenna 214, encapsulating material 216, and other components not shown to simplify the illustration. Die 208 may be mounted in electrical communication with lead frame 210, which may be any suitable arrangement of electrical conductors or leads 218 configured to allow one or more other circuits to operatively connect with die 210. Antenna 214 may be constructed as a part of the manufacturing process that produces lead frame 210.

Leads 218 may be embedded or fixed in a lead frame substrate 220, shown in phantom lines, corresponding to package substrate 114. The lead frame substrate may be any suitable insulating material configured to substantially hold leads 218 in a predetermined arrangement. Electrical communication between die 208 and leads 218 of lead frame 210 may be accomplished by any suitable method using conductive connectors 212. As mentioned, conductive connectors 212 may include bond wires that electrically connect terminals on a circuit of die 208 with the corresponding lead conductors 218. For example, a conductor or lead 218 may include a plated lead 222 formed on an upper surface of lead frame substrate 220, a via 224 extending through the substrate, and a flip-mounting bump 226 mounting the IC package 202 to a circuit on a base substrate, such as a PCB, not shown. The circuit on the base substrate may include external conductors, such as external conductor 204, which for example, may include a strip conductor 228 connecting bump 226 to a further via 230 extending through the base substrate. Other vias 232 may extend through lead frame substrate 220 and there may be additional vias 234 extending through the base substrate.

In another example, die 208 may be inverted and conductive connectors 212 may include bumps, or die solder balls, as described previously, which may be configured to electrically connect points on a circuit of die 208 directly to the corresponding leads 218 in what is commonly known as a "flip chip" arrangement.

In one example, first and second communication units, similar to communication units 100 and 200, may be co-located on a single PCB and may provide intra-PCB communication. In other examples, a first communication device may be located on a first PCB and a second communication device may be located on a second PCB and may therefore provide inter-PCB communication. In an embodiment, either of the two communication devices may be configured to transmit and/or receive electromagnetic signals, providing one- or two-way communication between the first and the second communication devices respectively, and accompanying electronic circuits or components.

In another example, the communication units may be designed and configured to transmit and/or receive signals with another communication along the plane of a PCB. The communication unit may be provided as a circuit package or an IC package, in which an antenna connected to a planar die having a circuit are encapsulated in an encapsulating material. The plane of the planar die may extend along the PCB and may be substantially parallel to the plane of the PCB. The IC package of the communication unit may also include a ground plane and a lead frame operatively connected to a circuit. The lead frame may have a plurality of conductor elements, which are so arranged as to reflect electromagnetic signals transmitted by the antenna away from the lead frame. This also helps in keeping the transmission of the electromagnetic signals in a desired direction and along the plane of the PCB. Further, the communication units may be configured to operate at a predetermined wavelength and the lead frame can include a plurality of separate conductor elements arranged sufficiently close together to reflect electromagnetic energy having said predetermined wavelength. Also, the lead frame may be disposed such that it may cause a transmitted electromagnetic energy to be greater in a region extending from said the communication unit and generally away from the lead frame.

Regardless of where the communication units are mounted, it remains important to provide adequate signal security and integrity when communicating between any two communication units. One method for enhancing or ensuring proper signal security and integrity is to verify that the second communication unit is within a predetermined range before or during a communication attempt. To that end, systems and methods for detecting the presence of the second communication unit and/or for ensuring another device or surface is within a certain distance may be included. Examples of such systems and methods are described in U.S. Provisional Patent Application Ser. No. 61/497,192, which is hereby incorporated in its entirety for all purposes.

Figure 3:
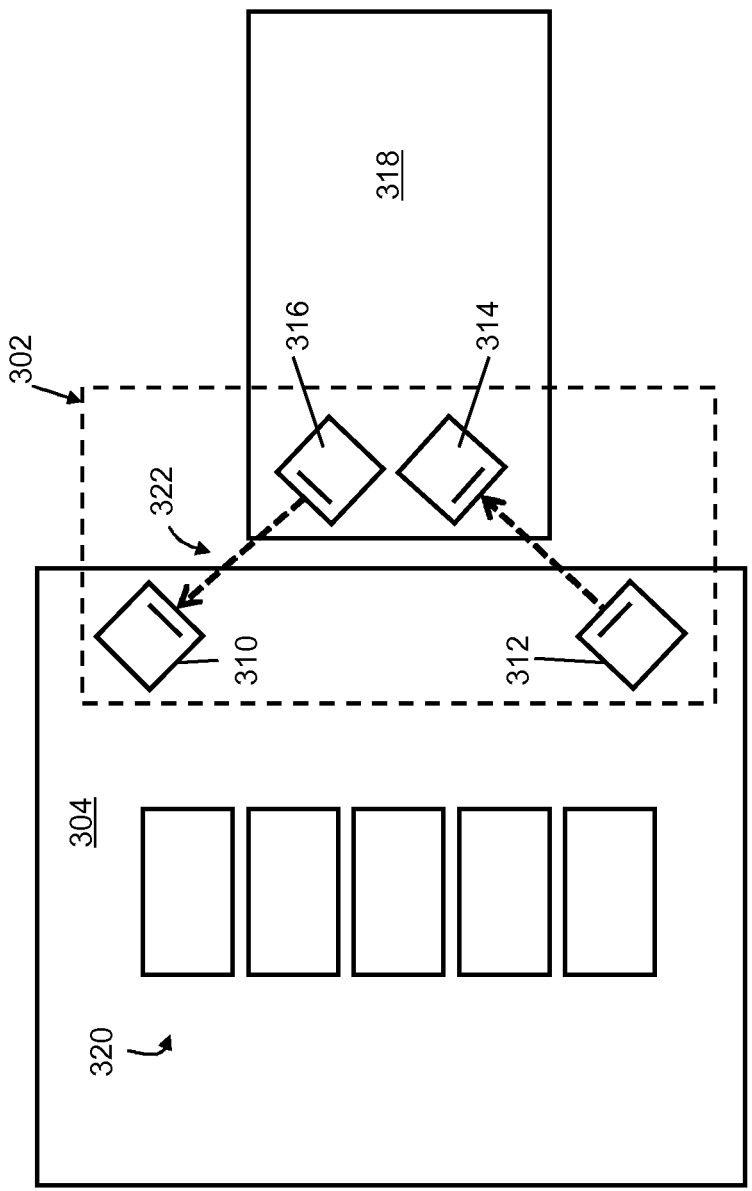
FIG. 3 is a perspective view of an illustrative arrangement of exemplary communication units positioned on a PCB.

Referring now to FIG. 3, exemplary communication units forming a connector 302 in an electronic system are shown. A pair of communication units 310 and 312 are disposed on a PCB 304 and another pair of communication units 314 and 316 are disposed on a separate PCB 318. The communication units 310, 312, 314 and 316 can enable information and/or data exchange between electronic components or circuits on the two PCBs 304 and 318, such as electronic components 320 on PCB 304. Furthermore, this allows data or other information to be exchanged without the need of mechanical connectors. For example, communication units 310, 312, 314 and 316 can communicate using EHF signals. An example of such communication is illustrated in FIG. 3 by arrows 322 indicating exemplary directions in which the signals may be transmitted between the communication units with respect to the PCBs. For example, it is shown that the communication units are arranged in an angled fashion such that there is no crosstalk between the communication units and signal transfer takes place as desired. However, it should be appreciated that there may be various other ways of signal transmission, without deviating from the scope of the disclosure. A few additional exemplary signal transmission directions are illustrated in FIGS. 5-7.

Figure 4:
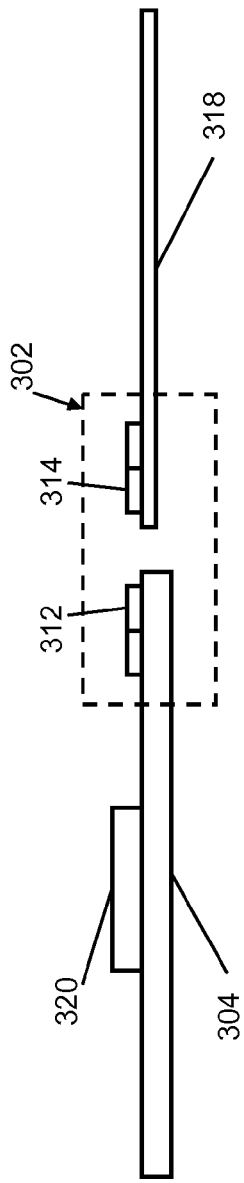
FIG. 4 is a side view of the components of FIG. 3.

FIG. 4 shows a side view of the system of FIG. 3. As depicted, communication units 312 and 314 are quite small relative to conventional mechanical connectors. Further, as may be seen from FIG. 4, communications units 312 and 314 do not add substantially to the overall height of PCBs 304 and 318 and related electronic components 320. This is what is meant by a "zero height" or "zero height impact" connector. Conversely, conventional mechanical connectors, in addition to a larger footprint, typically add significantly to the overall height of the PCBs, with a corresponding significant impact on the overall height and dimensions of a device containing the components.

Furthermore, as depicted in FIG. 4, communication units 312 and 314 may have substantially the same height as that of related electric components 320 on PCBs 304 and 318, thereby not adding to the overall height of PCB 304 and 318. For example, the communication unit may have an uppermost surface having a height from the surface of the PCB, and that height may be less than or equal to the height of at least one other component on the PCB.

Figure 5:
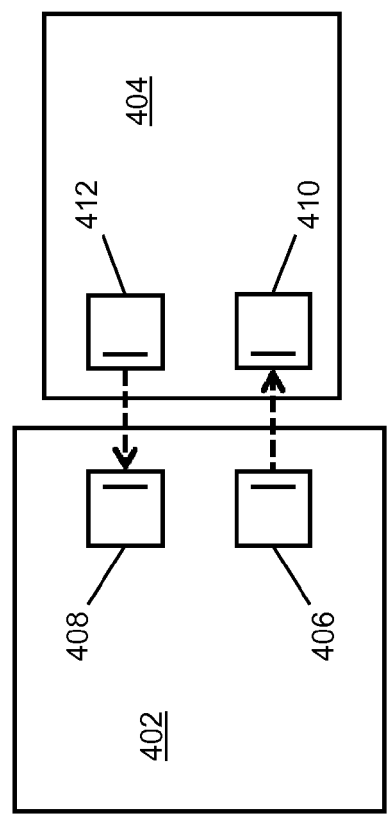
FIG. 5 shows an illustrative arrangement of exemplary communication units in a straight-across orientation.
Figure 6:
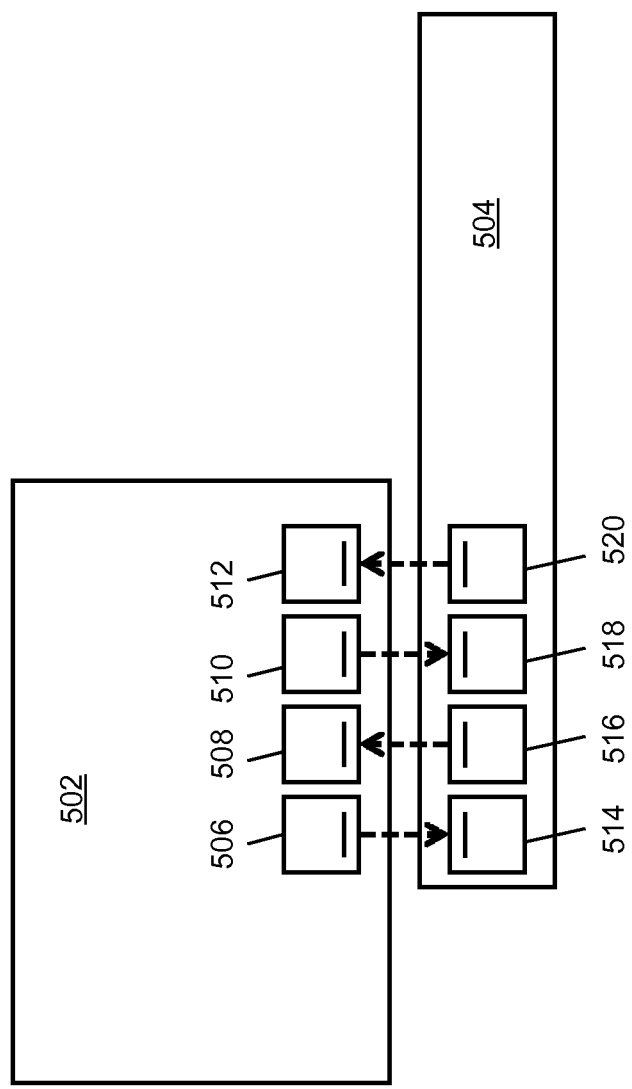
FIG. 6 shows an illustrative arrangement of exemplary communication unit pairs in an in-line orientation.
Figure 7:
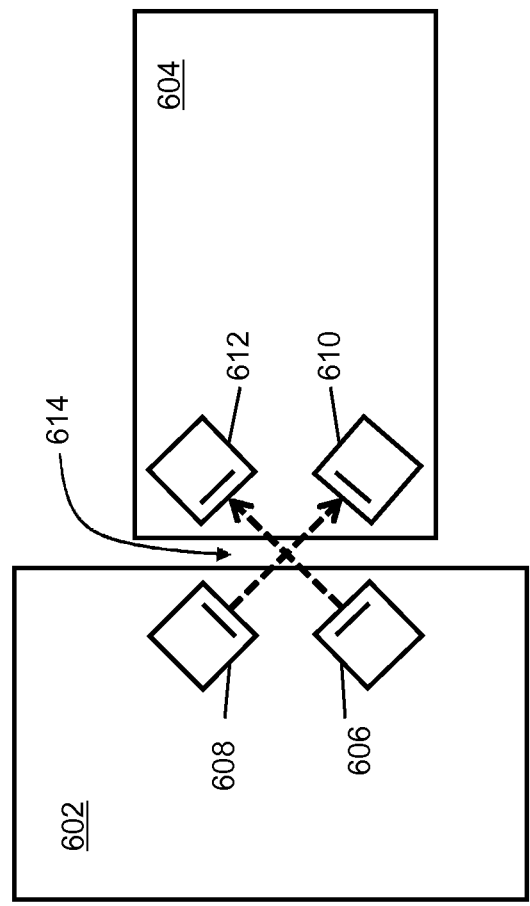
FIG. 7 shows an illustrative arrangement of exemplary communication unit pairs in a crossing orientation.

FIGS. 5-7 illustrate various examples of communicating pairs of the communication units on a first device and a second device. The figures also illustrate different directions in which the signals may be transmitted between the pairs of communication units.

For example, there is shown in FIG. 5 a first PCB 402 and a second PCB 404 in close proximity to each other. In some examples, first PCB 402 may be part of a first device and second PCB 404 may be part of a second device. First PCB 402 is shown to include a first pair of communication units 406 and 408. Communication unit 406 may be configured to act as a transmitter and communication unit 408 may be configured as a receiver. Similarly, second PCB 404 is shown to include a second pair of communication units 410 and 412. Communication unit 410 may be configured as a receiver, and communication unit 412 may be configured as a transmitter. Furthermore, communication unit 406 may be configured to transmit and communication unit 410 may be configured to receive, electromagnetic (EM) radiation having a first polarization characteristic. Similarly, communication unit 412 may be configured to transmit, and communication unit 408 may be configured to receive, EM radiation having a second polarization characteristic that is different than the first polarization characteristic. PCB 402 and PCB 404 may be further configured so that when PCB 402 is placed proximate to and in lateral alignment with PCB 404, communication unit 406 is aligned with and facing communication unit 410 and communication unit 408 is aligned with and facing communication unit 412, thereby enabling communication via electromagnetic signals between PCBs 402 and 404 and any respective devices containing those PCBs. In this example, the pairs of communication units are arranged in a straight-across orientation, unlike the previous example.

FIG. 6 shows another example in which more than two pairs of communication units may communicate between a first and a second device. As shown in FIG. 6, a first device PCB 502 may include four communication units 506, 508, 510, and 512, all aligned with antennas proximate an edge of the first PCB. A second device PCB 504 may be a wand-like or elongate PCB having a corresponding four communication units, all aligned with antennas proximate an edge of the second PCB. As depicted, the first and second PCBs may be aligned such that each of the four communication units of one PCB is aligned with a corresponding communication unit on the other PCB, enabling EHF communication on multiple channels.

FIG. 7 depicts an embodiment of a system including a two-chip device in communication with another two-chip device. In the example of FIG. 7, a communication system 600 includes a first device 602 having two mounted communication units 606 and 608, and a second device 604 having two mounted communication units 610 and 612.

In device 602, the antennas of communication units 606 and 608 are each disposed orthogonally and mutually spaced away from the other along a common side of the device. The antennas of communication units 610 and 612 are also orthogonal and disposed apart along a common side of device 604 so that each antenna is aligned with and proximate an antenna of one of communication units 606 and 608 when the respective common sides of devices 602 and 604 are disposed in facing relationship, as depicted.

Specifically, when configured and positioned as shown, the antenna of communication unit 608 is directed toward and proximate to the antenna of communication unit 610, and the antenna of communication unit 606 is directed toward and proximate to the antenna of communication unit 612.

Described in another way, and returning to FIG. 3, if an antenna end of each communication unit is defined as the end including the antenna, and an opposite end is defined as the end opposite the antenna end, then orienting two communication units 314 and 316 of PCB 304 with their opposite ends closer together as in FIG. 3 results in the antenna ends being directed away from each other into respective spaced-apart radiation regions. Second PCB 318 then has two corresponding packages 310 and 312 spaced significantly farther apart so that when the common sides of the two PCBs are positioned facing each other, the associated antenna ends of the PCB 318 packages are facing the corresponding antenna ends of the PCB 304 packages. More specifically, the antenna end of unit 310 faces the antenna end of unit 316 and the antenna end of unit 312 faces the antenna end of unit 314.

Turning back to FIG. 7, the respective opposite ends of the communication units on each device are spaced farther apart than the respective antenna ends. When devices 602 and 604 are placed with the common sides in proximity, the four antennas face a common radiation region 614 disposed between the respective antennas, with the antennas of communication units 606 and 612 and the antennas of communication units 608 and 610, being parallel. Each antenna is also orthogonal to the two adjacent antennas. For example, the antenna of communication unit 612 is orthogonal to the antennas of communication units 608 and 610. This arrangement allows two substantially identical devices to communicate as shown in FIG. 7, by taking advantage of the linear polarization effect. Although the paths of radiation intersect in radiation region 614, interference is minimized by the polarization differences.

Figure 8:
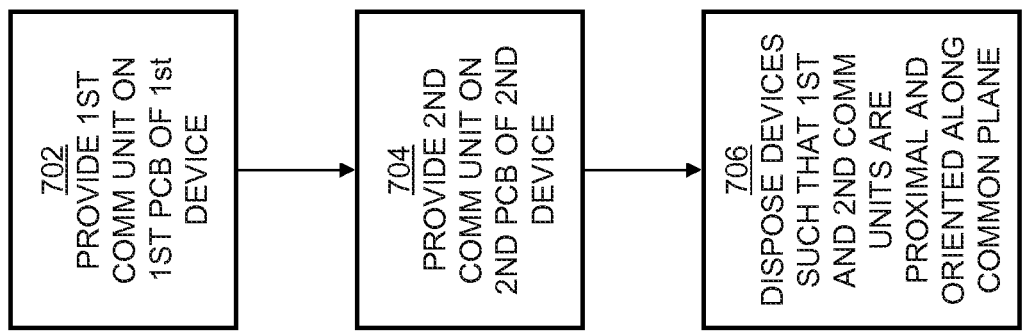
FIG. 8 shows an illustrative method of communication between two exemplary electronic devices.

FIG. 8 shows an illustrative method 700 of communication between a first electronic device and a second electronic device. In the illustrative method, the first electronic device has a first PCB and a first set of electronic components mounted on the first PCB. The second electronic device has a second PCB and a second set of electronic components mounted on the second PCB. Step 702 may include providing a first EHF communication unit on the first PCB of the first electronic device. The first EHF communication unit may have an uppermost surface having a first height from the substantially planar surface of the first PCB. Step 704 may include providing a second EHF communication unit on the second PCB of the second electronic device. Similarly, the second EHF communication unit may have an uppermost surface having a second height from the substantially planar surface of the second PCB. Step 706 may include disposing the first electronic device and the second electronic device such that the first EHF communication unit and the second EHF communication unit are substantially proximal and oriented substantially along a common plane. The first EHF communication unit and the second EHF communication unit may provide communication between the first electronic device and the second electronic device by mutually transmitting and receiving electromagnetic radiation in a direction along the common plane.

Accordingly, a system, device, or method including low-profile connectors as described above may include one or more of the following examples.

In a first example, an electronic device may include a printed circuit board (PCB) having a substantially planar surface and one or more electronic components mounted thereon. A first extremely high frequency (EHF) communication unit may be mounted on the substantially planar surface of the PCB. The first EHF communication unit may include at least a first planar die containing at least a first communication circuit, the first die extending along the substantially planar surface of the PCB in a die plane, and a first antenna operatively connected to the first circuit by interconnecting conductors. The first antenna may be configured to at least one of transmit and receive electromagnetic radiation along a plane of the substantially planar surface of the PCB. The first EHF communication unit may have an uppermost surface having a height from the substantially planar surface of the PCB. The first EHF communication unit height may be determined by an uppermost surface of the die, the first antenna, and the interconnecting conductors.

The electronic device may further include a second antenna operatively connected to the at least first communication circuit. The first antenna may be configured to transmit electromagnetic radiation and the second antenna may be configured to receive electromagnetic radiation. The first and second antennas may transmit or receive linearly polarized electromagnetic radiation. A first polarization direction vector of electromagnetic radiation transmitted by the first antenna may be oriented orthogonally to a second polarization direction vector of electromagnetic radiation received by the second antenna. An orientation of the first antenna on the PCB may be substantially orthogonal to an orientation of the second antenna on the PCB. The first antenna on the PCB may be substantially parallel to an orientation of the second antenna on the PCB.

The first EHF communication unit may further include a lead frame and a ground plane operatively connected to the first circuit. The first antenna may be configured to operate at a predetermined wavelength, and the lead frame may include a plurality of separate conductor elements arranged sufficiently close together to reflect electromagnetic energy having the predetermined wavelength. The lead frame may be disposed adjacent to the first circuit, and the lead frame may be configured to cause a transmitted electromagnetic energy to be greater in a region extending from the first antenna and generally away from the lead frame. The EHF communication unit may further comprise an encapsulating material to encapsulate the die, the first circuit, the first antenna, the interconnecting conductors, the lead frame and the ground plane to comprise a circuit package, and the first EHF communication unit height may be determined by an uppermost surface of the encapsulating material.

The first EHF communication unit height may be less than or equal to a corresponding height for each of the one or more electronic components.

In another example, an electronic system may include a first electronic device including a first printed circuit board (PCB). The first PCB may have a substantially planar surface and a first set of electronic components mounted thereon. The first electronic device may include a first extremely high frequency EHF communication unit mounted on the substantially planar surface of the first PCB substantially proximal to a first edge of the first PCB. The first EHF communication unit may include a first planar die containing a first circuit, the first planar die extending along the substantially planar surface of the first PCB in a first die plane. A first antenna may be operatively connected to the first circuit by interconnecting conductors, the first antenna being configured to transmit electromagnetic radiation along a plane of the substantially planar surface of the first PCB. The first EHF communication unit may have an uppermost surface having a height from the substantially planar surface of the first PCB, the first EHF communication unit height being determined by an uppermost surface of the first planar die, the first antenna, and the interconnecting conductors. A second electronic device may include a second PCB, the second PCB having a substantially planar surface, a second edge and a second set of electronic components mounted on the substantially planar surface. The substantially planar surface of the second PCB may extend along a plane of the substantially planar surface of the first PCB. During use, the first edge of the first PCB may face the second edge of the second PCB. The second electronic device may include a second EHF communication unit mounted on the substantially planar surface of the second PCB substantially proximal to the second edge of the second PCB. The second EHF communication unit may include a second planar die containing a second circuit, the second planar die extending along the substantially planar surface of the second PCB in a second die plane. A second antenna may be operatively connected to the second circuit by interconnecting conductors, the second antenna being configured to receive electromagnetic radiation transmitted by the first antenna along a plane of the substantially planar surface of the second PCB. The second EHF communication unit may have an uppermost surface having a height from the substantially planar surface of the second PCB, the second EHF communication unit height being determined by an uppermost surface of the second planar die, the second antenna, and the interconnecting conductors.

The first electronic device may further include a third EHF communication unit mounted on the substantially planar surface of the first PCB and the second electronic device may further include a fourth EHF communication unit mounted on the substantially planar surface of the second PCB. The first and third EHF communication units may be disposed in a substantially parallel orientation on the first PCB; and the second and fourth EHF communication units may be disposed in a substantially parallel orientation on the second PCB. The first and third EHF communication units may be disposed in a substantially orthogonal orientation on the first PCB; and the second and fourth EHF communication units may be disposed in a substantially orthogonal orientation on the second PCB.

The EHF communication units may be configured and aligned such that placing the first electronic device in close proximity to the second electronic device enables data to be communicated wirelessly and contactlessly between the first electronic device and the second electronic device.

The substantially planar surface of the first PCB and the substantially planar surface of the second PCB may be substantially coplanar during use.

The substantially planar surface of the first PCB and the substantially planar surface of the second PCB may be substantially parallel and non-coplanar during use.

An illustrative method of communication between a first electronic device and a second electronic device, the first electronic device having a first PCB and a first set of electronic components mounted on the first PCB, the second electronic device having a second PCB and a second set of electronic components mounted on the second PCB, may include providing a first EHF communication unit on the first PCB of the first electronic device. The first EHF communication unit may have an uppermost surface having a first height from the substantially planar surface of the first PCB. A second EHF communication unit may be provided on the second PCB of the second electronic device, wherein the second EHF communication unit has an uppermost surface having a second height from the substantially planar surface of the second PCB. The first electronic device and the second electronic device may be disposed such that the first EHF communication unit and the second EHF communication unit are substantially proximal and oriented substantially along a common plane. The first EHF communication unit and the second EHF communication unit may provide communication between the first electronic device and the second electronic device by mutually transmitting and receiving electromagnetic radiation in a direction along the common plane.

INDUSTRIAL APPLICABILITY

The inventions described herein relate to industrial and commercial industries, such as electronics and communications industries using devices that communicate with other devices or devices having communication between components in the devices.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

Although the present invention has been shown and described with reference to the foregoing operational principles and preferred embodiments, it will be apparent to those skilled in the art that various changes in form and detail may be made without departing from the spirit and scope of the invention. The present invention is intended to embrace all such alternatives, modifications and variances that fall within the scope of the appended claims.

What is claimed is:

1. An electronic device comprising:
 a first printed circuit board (PCB), having a substantially planar surface and one or more electronic components mounted thereon;
 a first extremely high frequency (EHF) communication unit mounted on the substantially planar surface of the first PCB, the first EHF communication unit comprising:
  a first planar die extending along the substantially planar surface of the first PCB in a die plane;
  a first communication circuit on the first planar die; and
  a first antenna operatively connected to the first communication circuit by interconnecting conductors, the first antenna configured to transmit first linearly polarized electromagnetic radiation of a first polarization direction vector, the first linearly polarized electromagnetic radiation transmitted along a plane of the substantially planar surface of the first PCB;
  wherein the first EHF communication unit has an uppermost surface having a height from the substantially planar surface of the first PCB, the first EHF communication unit height being determined by an uppermost surface of the die, the first antenna, and the interconnecting conductors; and
 a second EHF communication unit mounted on the substantially planar surface of the first PCB, the second EHF communication unit comprising:
  a second planar die extending along the substantially planar surface of the first PCB in a die plane;
  a second communication circuit on the second planar die; and
  a second antenna operatively connected to the second communication circuit by interconnecting conductors, the second antenna configured to receive second linearly polarized electromagnetic radiation of a second polarization direction vector that is oriented orthogonally to the first polarization direction vector, the second linearly polarized electromagnetic radiation received along the plane of the substantially planar surface of the first PCB.

2. The electronic device of claim 1, wherein an orientation of the first antenna is substantially orthogonal to an orientation of the second antenna.

3. The electronic device of claim 1, wherein an orientation of the first antenna is substantially parallel to an orientation of the second antenna.

4. The electronic device of claim 1, wherein the first EHF communication unit further comprises a lead frame and a ground plane operatively connected to the first communication circuit.

5. The electronic device of claim 4, wherein the first antenna is configured to operate at a predetermined wavelength and the lead frame includes a plurality of separate conductor elements arranged sufficiently close together to reflect electromagnetic energy having the predetermined wavelength.

6. The electronic device of claim 5, wherein the lead frame is disposed adjacent to the first communication circuit, and wherein the lead frame is configured to cause a transmitted electromagnetic energy to be greater in a region extending from the first antenna and generally away from the lead frame.

7. The electronic device of claim 4, wherein the first EHF communication unit further comprises an encapsulating material to encapsulate the die, the first communication circuit, the first antenna, the interconnecting conductors, the lead frame and the ground plane to comprise a circuit package, and the first EHF communication unit height is determined by an uppermost surface of the encapsulating material.

8. The electronic device of claim 1, wherein the first EHF communication unit height is less than or equal to a corresponding height for each of the one or more electronic components.

9. An electronic system comprising:
the electronic device of claim 1; and
a second electronic device, the second electronic device comprising:
a second PCB, having a substantially planar surface and one or more second electronic components mounted thereon;
a third EHF communication unit mounted on the substantially planar surface of the second PCB, the third EHF communication unit comprising:
a third planar die extending along the substantially planar surface of the second PCB in a die plane;
a third communication circuit on the third planar die; and
a third antenna operatively connected to the third communication circuit by interconnecting conductors, the third antenna configured to receive the first linearly polarized electromagnetic radiation of the first polarization direction vector, the first linearly polarized electromagnetic radiation received along a plane of the substantially planar surface of the second PCB; and
a fourth EHF communication unit mounted on the substantially planar surface of the second PCB, the fourth EHF communication unit comprising:
a fourth planar die extending along the substantially planar surface of the second PCB in a die plane;
a fourth communication circuit on the fourth planar die; and
a fourth antenna operatively connected to the fourth communication circuit by interconnecting conductors, the fourth antenna configured to transmit the second linearly polarized electromagnetic radiation of the second polarization direction vector, the second linearly polarized electromagnetic radiation transmitted along the plane of the substantially planar surface of the second PCB.

10. The electronic system of claim 9, wherein the first and second EHF communication units are disposed in a substantially parallel orientation on the first PCB; and the third and fourth EHF communication units are disposed in a substantially parallel orientation on the second PCB.

11. The electronic system of claim 9, wherein the first and second EHF communication units are disposed in a substantially orthogonal orientation on the first PCB; and the third and fourth EHF communication units are disposed in a substantially orthogonal orientation on the second PCB.

12. The electronic system of claim 9, wherein the first EHF communication unit and the third EHF communication unit are configured and aligned such that placing the first electronic device in close proximity to the second electronic device enables data to be communicated wirelessly and contactlessly between the first electronic device and the second electronic device.

13. The electronic system of claim 9, wherein the substantially planar surface of the first PCB and the substantially planar surface of the second PCB are substantially coplanar during use.

14. The electronic system of claim 9, wherein the substantially planar surface of the first PCB and the substantially planar surface of the second PCB are substantially parallel and non-coplanar during use.

15. The electronic device of claim 1,
wherein the first antenna configured to transmit the first linearly polarized electromagnetic radiation of the first polarization direction vector is the only antenna of the first communication unit, and
wherein the second antenna configured to receive the second linearly polarized electromagnetic radiation of the second polarization direction vector is the only antenna of the second communication unit.

16. The electronic device of claim 1, wherein the first circuit is to:
detect an other EHF communication unit when an other device that includes the other EHF communication unit is within a specified distance from the first EHF communication unit, and
verify that the other EHF communication unit is within the specified distance during an attempt by the first EHF communication unit to transmit electromagnetic radiation to the other EHF communication unit.

17. The electronic device of claim 1, wherein the first communication unit is proximate an edge of the first PCB and includes a first end including the first antennae, wherein the second communication unit is proximate the edge of the first PCB and includes a second end including the second antennae, wherein the first end and the second end face the edge of the first PCB.

18. The system of claim 9, wherein the first communication unit includes a first end including the first antennae, the second communication unit includes a second end including the second antennae, the third communication unit includes a third end including the third antennae, and the fourth communication unit includes a fourth end including the fourth antennae, the first end and the third end facing towards each other, and the second end and the fourth end facing towards each other.

19. The system of claim 9, wherein the first PCB includes a first edge proximate to the first communication unit and the second communication unit, and the second PCB includes a second edge proximate to the third communication unit and the fourth communication unit, the first edge facing the second edge during communications.

20. The electronic device of claim 1, wherein the first communication unit is a first IC package and the second communication unit is a second IC package.

* * * * *